US006643501B1

(12) United States Patent
McKeen et al.

(10) Patent No.: US 6,643,501 B1
(45) Date of Patent: Nov. 4, 2003

(54) FLEXIBLE FERRITE GASKET FOR RECEIVER SECOND IMAGE PROTECTION

(75) Inventors: Trent McKeen, Burnaby (CA); Dominque Kwong, Vancouver (CA)

(73) Assignee: Sierra Wireless, Inc., Richmond (CA)

( * ) Notice: Subject to any disclaimer, the term of this patent is extended or adjusted under 35 U.S.C. 154(b) by 0 days.

(21) Appl. No.: 09/454,943

(22) Filed: Dec. 2, 1999

(51) Int. Cl.[7] .................................................. H04B 1/10
(52) U.S. Cl. ....................... 455/300; 455/296; 455/302; 455/306; 455/307; 333/12; 333/184; 333/185
(58) Field of Search ................................. 455/296, 302, 455/300, 306, 294, 307, 310, 312, 313, 314; 333/181, 182, 184, 185, 186, 12

(56) References Cited

U.S. PATENT DOCUMENTS

| 4,622,527 A | | 11/1986 | Carlson | |
|---|---|---|---|---|
| 4,796,079 A | * | 1/1989 | Hettiger | 174/260 |
| 5,561,265 A | * | 10/1996 | Livshits et al. | 174/35 GC |
| 5,628,058 A | * | 5/1997 | Hiraki | 361/800 |
| 5,678,216 A | * | 10/1997 | Matai | 343/700 MS |
| 5,752,174 A | * | 5/1998 | Matai et al. | 455/183.1 |
| 5,789,999 A | * | 8/1998 | Barnett et al. | 333/172 |
| 5,905,417 A | * | 5/1999 | Norte et al. | 333/185 |
| 6,094,588 A | * | 7/2000 | Adam | 333/205 |
| 6,252,313 B1 | * | 6/2001 | Zhang et al. | 307/91 |

* cited by examiner

*Primary Examiner*—Lee Nguyen
*Assistant Examiner*—Khawar Iqbal
(74) *Attorney, Agent, or Firm*—Thelen Reid & Priest, LLP; Robert E. Krebs; J. Davis Gilmer

(57) ABSTRACT

In a superheterodyne receiver, energy can bypass a filter by magnetically coupling to a metallic radio frequency shield. This is especially a problem with small form factor devices in which the metallic radio frequency shield is positioned close to the filter. By using a ferrite-embedded element positioned between the filter and the RF shield, some of the undesired harmonics produced by the mixer can be dissipated into heat.

18 Claims, 5 Drawing Sheets

FLEXIBLE FERRITE GASKET FOR RECEIVER SECOND IMAGE PROTECTION

BACKGROUND OF THE INVENTION

Field of The Invention

The present invention relates to super heterodyne receivers, especially those which use multiple stages of mixers and filters.

FIG. 1 illustrates a prior art dual stage super heterodyne receiver 20. Signals are detected by the antennae 22 and filtered in band pass filter 23. Low noise amplifier 25 amplifies the signal and sends it to the first image filter 28. The mixer 24 receives the filtered signal and a signal from the local oscillator 26. The output of the mixer is sent to second image filter 34 which ideally filters away the undesired second image signals. A second stage also includes mixer 30.

A problem that can exist with super heterodyne receivers is that the filter 34 may not be able to completely remove the undesired image signal. It is desired to have an improved system that can more efficiently remove any second image frequencies.

SUMMARY OF THE INVENTION

It has been found that in small form factor systems, such as those used with cellular radio systems, undesired energy can bypass an image filter in the heterodyne receiver by magnetically coupling to and from a metallic radio frequency (RF) shield positioned close to the filter. The signals at the input of the filter magnetically couple to the RF shield, conduct along the surface of the shield and then couple from the shield to the output of the filter. This is especially a problem with a high impedance filters such as the type typically found in the first intermediate frequency (IF) stage of a dual-stage superheterodyne receiver. Such a high impedance filter typically uses large inductors in the matching networks at the input and output of the filter. Energy radiated by the large inductors can bypass the filter through the metallic RF shield.

Increasing the physical separation between the metal RF shield and the filter is one possible solution to this problem. However, with the increasing pressure to reduce the size of electronic devices, this solution is becoming less and less attractive. Another way to prevent this problem is by using complicated shielding structure in an attempt to isolate the input and output of the intermediate frequency filter. This solution is costly and difficult to manufacture.

The present invention comprises the use of a ferrite embedded element between the filter and the metallic RF shield to dissipate the undesired energy which radiate at the input of the filter and prevent such energies from bypassing the filter through the radio frequency shield. The ferrite embedded element will dissipate the radiated electromagnetic energy into heat. By using such a ferrite embedded element, the radio frequency shielding can be positioned close to the filter and the small form factor of the receiver maintained.

DETAILED DESCRIPTION OF THE PREFERRED EMBODIMENT

Figure 1A:
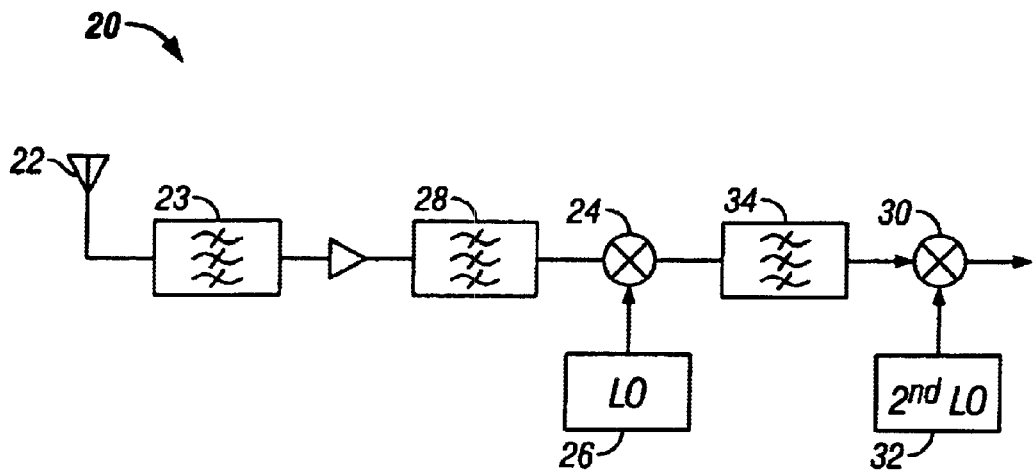
FIG. 1 is a diagram of a prior art superheterodyne receiver.
FIG. 1B is a diagram illustrating the frequency conversion of the first and second image along with the desired frequency in a dual stage super heterodyne receiver.

Looking at FIG. 1, the filter bypass typically occurs at the first IF stage of the superheterodyne receiver. The intermediate frequency filter 34 typically has a relatively high impedance of around 1000 ohms. Because of the high impedance, relatively large inductors are required for the matching network at the input and output of the filter 34.

In one embodiment, the desired frequency is centered at 882 MHz. The local oscillator 26 provides a 927 MHz signal. The mixer first produces an intermediate frequency signal at 45 MHz. The local oscillator 32 provides a signal at 44.5 MHz to the mixer 30 to produce a 450 kilohertz second IF signal.

Figure 1B:
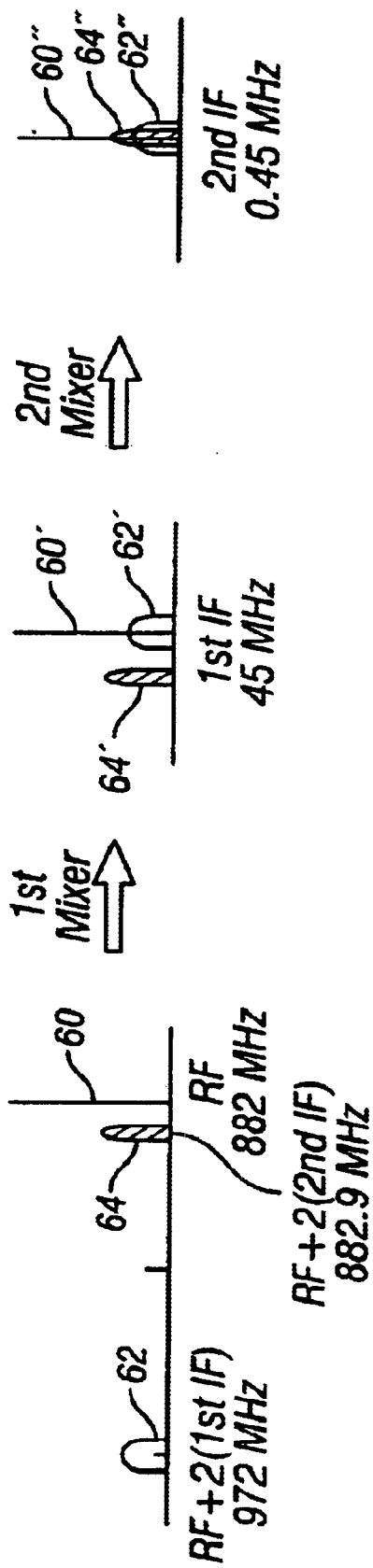

In addition to desired signals, energy such as the first and second image can be present at the antennae. This image energy will be shifted by the mixers into same frequency range as the desired signal unless the image energy is filtered away. For example, as shown in FIG. 1B, a desired signal 60, a first image 62 and a second image 64 are present at the antennae. Assuming high side injection in the first mixer, after the first mixing stage, both the desired signal energy 60' and the first image energy 62' will be present at the first IF. Assuming low side injection at the second mixer, both the desired signal 60" and the second image energy 64" are present at the second intermediate frequency. Filtering before the mixer, is done to remove as much of the image energy as possible. Typically, in superheterodyne receivers, the second image signal is more difficult to remove.

Figure 2A:
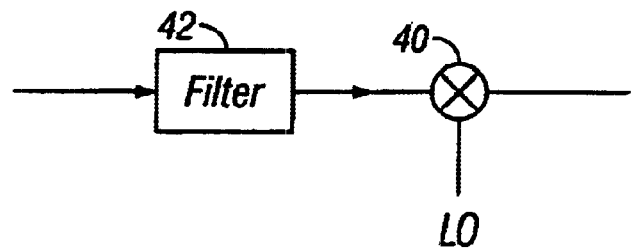
FIGS. 2A–2C are diagrams illustrating the operation of the system of the present invention.

FIG. 2A illustrates the ideal operation of a stage of a superheterodyne receiver. The desired energy and the image energy are sent to filter 42. Ideally, the filter 42 removes all of the undesired image energy. The mixer down converts the desired energy to a lower frequency range.

Figure 2B:
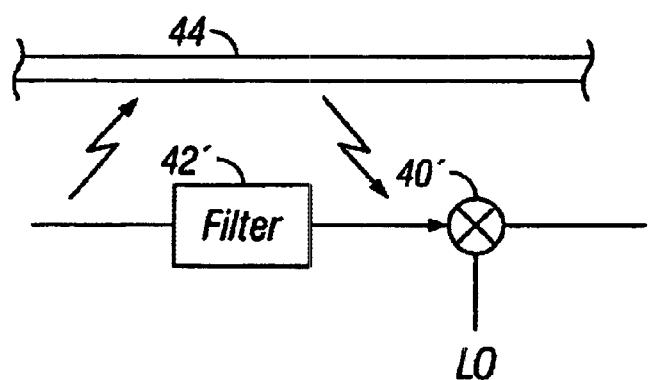

FIG. 2B illustrates a system that shows the second image frequency energy magnetically coupling with the metallic RF shield 44 positioned over the filter. Some of the second image energy magnetically couple with the output of the filter, bypassing the filter completely. This can reduce the filters image rejection performance by more than 30 dB.

Figure 2C:
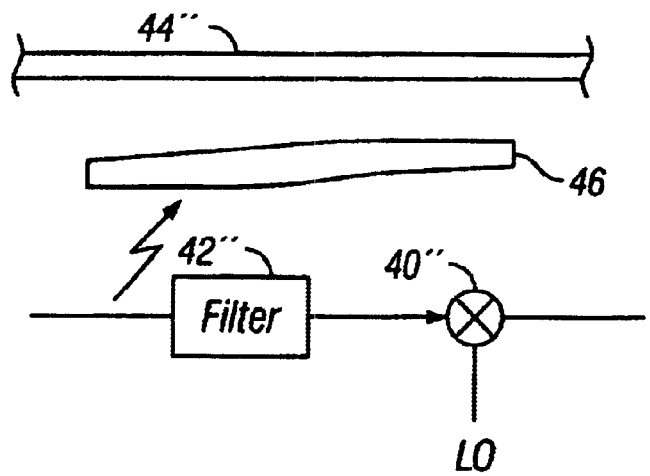

FIG. 2C shows the system with a ferrite embedded element 46 positioned between the filer and the RF shield. An example of a ferrite embedded element could be a flexible ferrite embedded gasket such as the type produced by the Tokin Corporation. As described above, the ferrite embedded element 46 dissipates the electromagnetic energy and prevents it from coupling to the output of the filter 42". This significantly reduces the second image response of the superheterodyne receiver.

Figure 3A:
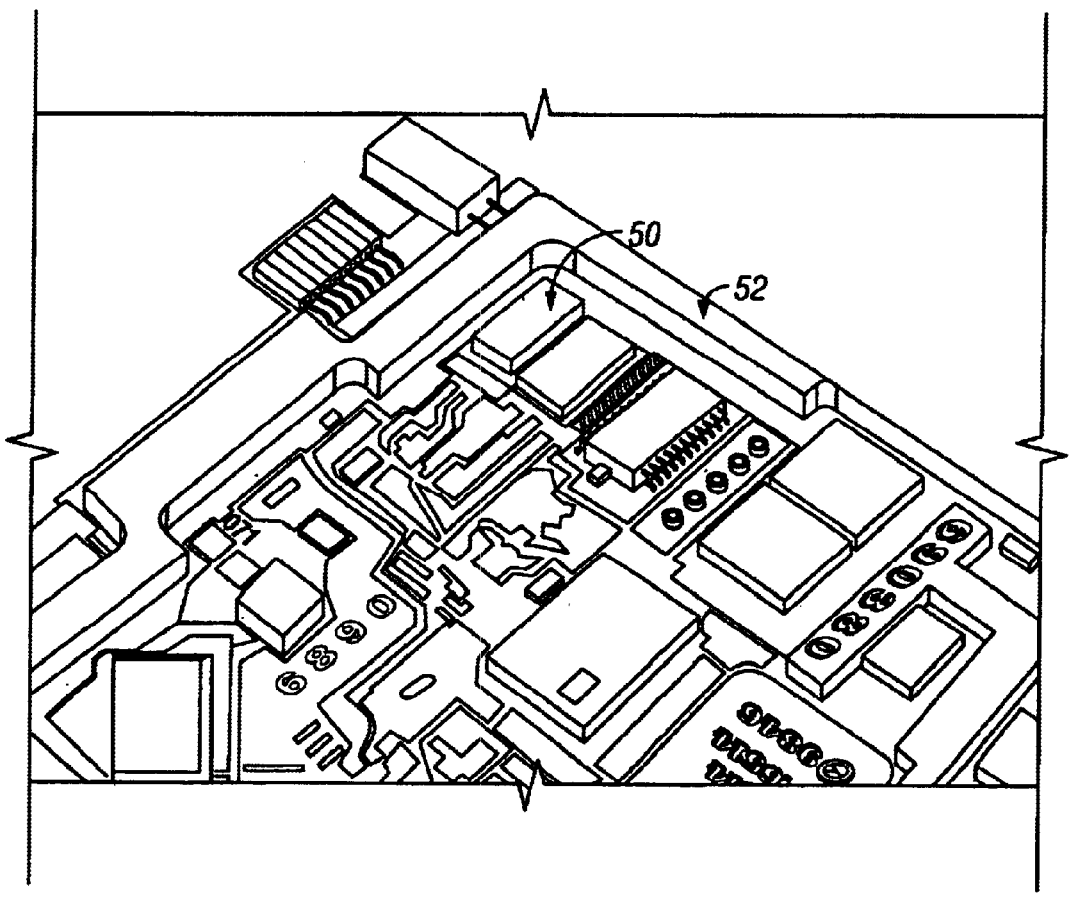
FIG. 3A is a diagram illustrating a receiver system without a ferrite embedded element.

FIG. 3A shows a photograph of a receiver with the top of the RF shield stripped away to show the filter 50. Also shown is a portion of the shield wall 52. In the actual device, the shield wall extends completely over the filter. Note how close the RF metal shield would be to the filter to keep the form factor small.

Figure 3B:
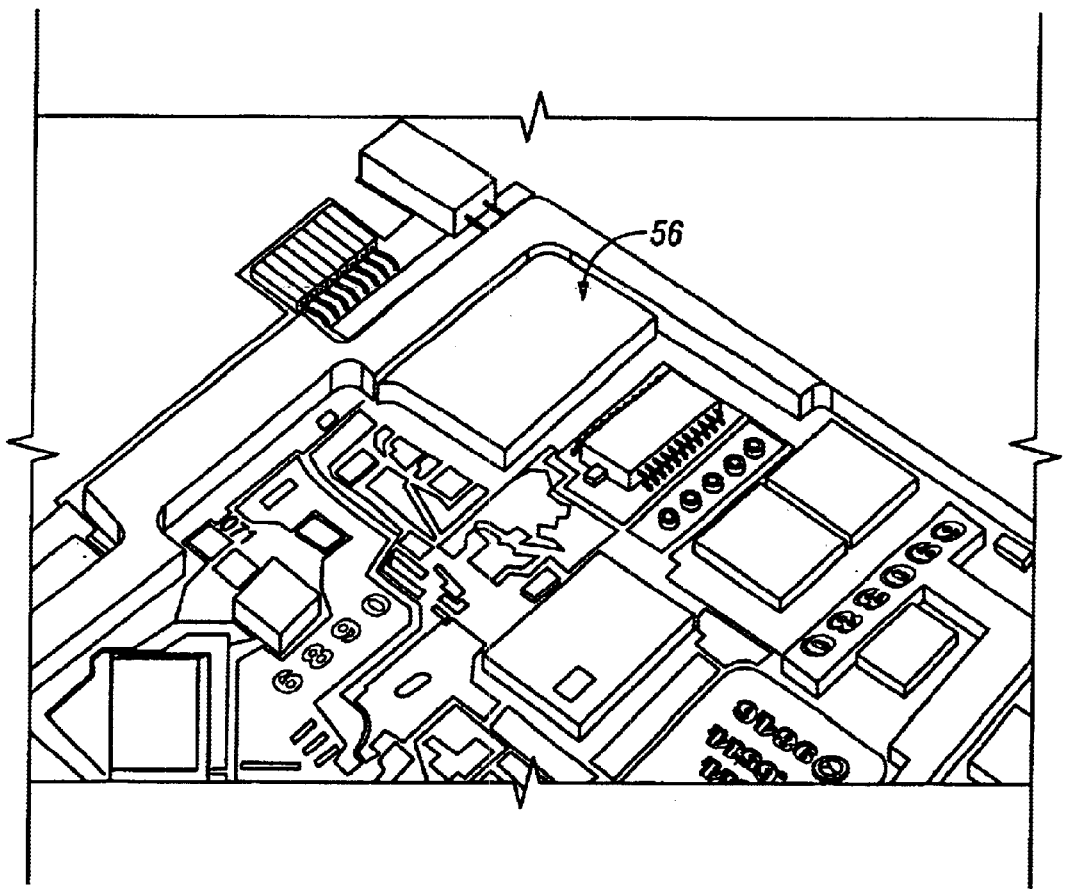
FIG. 3B is a diagram illustrating a receiver system using the ferrite embedded element of the present invention.

FIG. 3B shows a photograph of a receiver in which a ferrite embedded element, such as a flexible ferrite embedded gasket 56, is positioned between the RF shield and the filter.

Figure 4A:
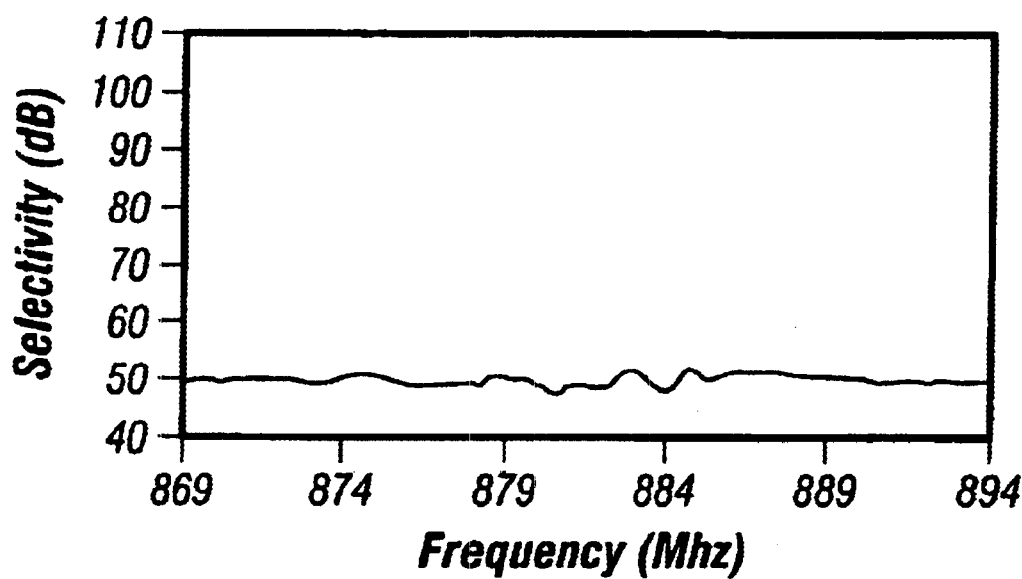
FIGS. 4A and 4B are graphs illustrating the improved second image rejection using the ferrite embedded element of the present invention.
Figure 4B:
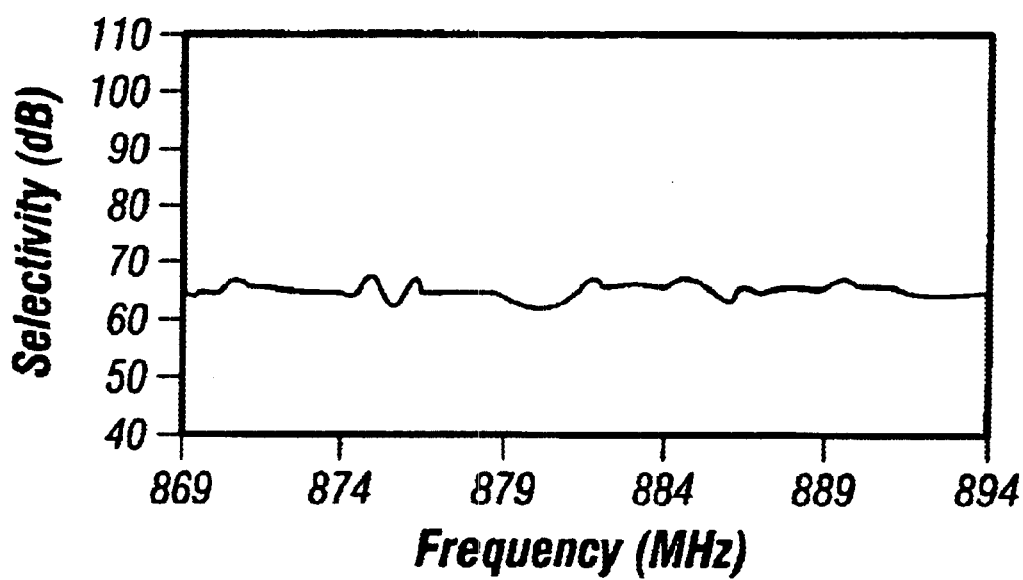

FIGS. 4A and 4B illustrate the improvement in the second image rejection observed when a 0.55 millimeter ferrite material was placed above the intermediate frequency filter and matching components used in a Sierra Wireless Air Card 300.

The selectivity of the desired frequency over the second image frequency is improved over 10 dB resulting in a receiver second image rejection of greater than 60 dB.

It will be appreciated by those of ordinary skill in the art that the invention can be implemented in other specific forms without departing from the spirit or character thereof. The presently disclosed embodiments are therefore considered in all respects to be illustrative and not restrictive. The scope of the invention is illustrated by the appended claims rather than the foregoing description, and all changes which come within the meaning and range of these claims are intended to be embraced herein.

What is claimed is:

1. An apparatus comprising:
    an image energy filter:
    a mixer operably connected to an output of the image filter and to a local oscillator signal;
    a metal radio frequency (RF) shield positioned over the filter; and
    a ferrite-embedded element placed between the filter and the metal RF shield, the ferrite-embedded element adapted to reduce the unwanted energy that would otherwise bypass the filter via the metal RF shield.

2. The apparatus of claim 1 wherein the ferrite-embedded element reduces the second image frequency energy that would otherwise bypass t (RF) shield.

3. The apparatus of claim 1 wherein the mixer and filter form a second stage of the receiver, further comprising a first stage comprising a additional mixer and filter, the output of the first stage providing the input to the second stage.

4. The apparatus of claim 1 wherein the apparatus is part of a receiver.

5. The apparatus of claim 4 wherein the apparatus form a part of a cellular radio.

6. The apparatus of claim 1 wherein the apparatus is a part of a relatively small form factor device.

7. The apparatus of claim 1 wherein the ferrite elements include iron fillings.

8. The apparatus of claim 1 wherein the filter is a relatively high impedance filter.

9. The apparatus of claim 1 wherein the filter includes a matching circuit with inductors at the input and output of the filter.

10. An apparatus comprising:
    an image energy filter having matching circuits including inductors;
    a mixer operably connected to an output of the image energy filter and to a local oscillator signal;
    a metal radio frequency shield positioned over the filter; and
    a ferrite-embedded element placed between the filter and the metal RF shield, the ferrite-embedded element adapted to dissipate energy radiated by the inductors.

11. The apparatus of claim 10 wherein the ferrite embedded element dissipates second image frequency energy produced by the mixer.

12. The apparatus of claim 10 wherein the mixer and filter comprise a second stage of a receiver, further comprising a first receiver stage including a mixer and filter wherein the output of the first receiver stage is the input to the second receiver stage.

13. The apparatus of claim 10, wherein the apparatus is part of a receiver.

14. The apparatus of claim 10 wherein the apparatus is part of a cellular radio.

15. The apparatus of claim 10 wherein the apparatus is part of a relatively small form factor device.

16. The apparatus of claim 10 wherein the ferrite comprises iron fillings.

17. The apparatus of claim 10 wherein the filter comprises a relatively high impedance device.

18. The apparatus of claim 10 wherein the filter has a matching circuit at the input and output including inductors.

* * * * *

UNITED STATES PATENT AND TRADEMARK OFFICE
CERTIFICATE OF CORRECTION

PATENT NO. : 6,643,501 B1 Page 1 of 1
DATED : November 4, 2003
INVENTOR(S) : Trent McKeen and Dominique Kwong It is certified that error appears in the above-identified patent and that said Letters Patent is hereby corrected as shown below:

<u>Title page,</u>
Item [75], replace "Dominque" with -- Dominique --.

<u>Column 3,</u>
Line 35, replace "t" with -- the filter via the metal --.

Signed and Sealed this

Ninth Day of March, 2004

JON W. DUDAS
*Acting Director of the United States Patent and Trademark Office*